(12) United States Patent
Nam

(10) Patent No.: US 7,531,455 B2
(45) Date of Patent: May 12, 2009

(54) METHOD FOR FORMING STORAGE NODE CONTACT IN SEMICONDUCTOR DEVICE USING NITRIDE-BASED HARD MASK

(75) Inventor: Ki-Won Nam, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 385 days.

(21) Appl. No.: 11/323,905

(22) Filed: Dec. 29, 2005

(65) Prior Publication Data

US 2007/0004196 A1 Jan. 4, 2007

(30) Foreign Application Priority Data

Jun. 30, 2005 (KR) .................. 10-2005-0058563

(51) Int. Cl.
*H01L 21/44* (2006.01)
*H01L 29/40* (2006.01)
(52) U.S. Cl. .................. 438/671; 257/621; 257/774
(58) Field of Classification Search .................. 438/254, 438/576, 595, 671, 675; 257/621, 774
See application file for complete search history.

(56) References Cited

U.S. PATENT DOCUMENTS

| 5,939,748 | A | * | 8/1999 | Takaishi | 257/310 |
| RE36,644 | E | * | 4/2000 | Dennison | 438/396 |
| 6,100,183 | A | * | 8/2000 | Lu et al. | 438/637 |
| 6,664,196 | B1 | * | 12/2003 | Wada et al. | 438/754 |
| 6,734,086 | B2 | * | 5/2004 | Suzuki | 438/575 |
| 6,734,097 | B2 | * | 5/2004 | Iggulden et al. | 438/626 |
| 6,878,646 | B1 | * | 4/2005 | Tsai et al. | 438/756 |
| 2004/0171212 | A1 | * | 9/2004 | Won et al. | 438/244 |

* cited by examiner

*Primary Examiner*—Calvin Lee
(74) *Attorney, Agent, or Firm*—Blakelt, Sokoloff, Taylor & Zafman

(57) ABSTRACT

A method for forming a storage node contact in a semiconductor device using a nitride-based hard mask is provided. The method includes: forming an inter-layer oxide layer on a substrate; forming a hard mask containing a nitride material on the inter-layer oxide layer; forming a mask pattern on the hard mask; etching the hard mask; etching the inter-layer oxide layer to form storage node contact holes; removing the hard mask; forming storage node contact spacers on lateral walls of the storage node contact holes; and forming storage node contact plugs filling the storage node contact holes.

10 Claims, 5 Drawing Sheets

METHOD FOR FORMING STORAGE NODE CONTACT IN SEMICONDUCTOR DEVICE USING NITRIDE-BASED HARD MASK

FIELD OF THE INVENTION

The present invention relates to a method for fabricating a semiconductor device; and, more particularly, to a method for forming a storage node contact in a semiconductor device.

DESCRIPTION OF RELATED ARTS

In a storage node contact formation process of a sub-90 nm level semiconductor device, polysilicon has been used as a hard mask to secure a necessary photoresist margin of ArF photoresist. However, several additional process steps have been generally required to remove the polysilicon before and after the storage node contact formation process.

FIGS. 1A to 1C are cross-sectional views illustrating a conventional method for forming a storage node contact in a semiconductor device.

As shown in FIG. 1A, an inter-layer oxide layer 12 is formed on a substrate 11, and then, a storage node contact (SNC) hard mask 13 is formed on the inter-layer oxide layer 12. Herein, the SNC hard mask 13 is formed by employing polysilicon. Also, the substrate 11 is defined into a cell region and a peripheral region.

Subsequently, SNC masks 14 are formed on the SNC hard mask 13, and then, portions of the SNC hard mask 13 are etched using the SNC masks 14 as an etch barrier.

As shown in FIG. 1B, the SNC masks 14 are stripped, and portions of the inter-layer oxide layer 12 are etched using the SNC hard mask 13 as an etch barrier to thereby form storage node contact holes 15.

Furthermore, a nitride layer for use as SNC spacers is formed on the above resulting substrate structure, and then a blanket etch-back process is performed to form SNC spacers 16. Herein, the SNC spacers 16 are formed on lateral walls of the storage node contact holes 15.

Moreover, a polysilicon layer 17 is formed on the above resulting substrate structure filling the storage node contact holes 15.

As shown in FIG. 1C, a blanket polysilicon etch-back process is performed to form storage node contact plugs 17A buried in the storage node contact holes 15. Herein, the SNC hard mask 13 is removed during the blanket polysilicon etch-back process.

Subsequently, a recess dry etching process is performed on portions of the inter-layer oxide layer 12.

However, in the aforementioned conventional technology, if a thickness of the SNC hard mask 13 with severe scattering reflection is more than a certain level, a misalignment occurs with a bottom key during a photo mask process. Thus, additional process such as an SNC key open mask, etching, and stripping/cleaning processes are necessary.

Furthermore, as shown in FIG. 1B, remaining portions of the SNC hard mask 13A and 13B in the cell region and the peripheral region show a difference in thickness after the inter-layer oxide layer 12 is etched.

An etch loss is more severe in the remaining portions of the SNC hard mask 13A in the finely patterned cell region than the remaining portion of the SNC hard mask 13B in the peripheral region with no pattern. Thus, the portion of the SNC hard mask 13B in the peripheral region remains thicker after the inter-layer oxide layer 12 is etched.

With the thickness difference between the portions of the SNC hard mask 13A and 13B as described above, the SNC hard mask 13 remaining on the wafer is generally required to be removed completely during the blanket polysilicon etch-back process for forming the storage node contact plugs 17A. Because of the thickness difference of the SNC hard mask 13 in the cell region and the peripheral region, an excessive etching process is performed with the peripheral region as a reference. Herein, an excessive etch loss occurs in the storage node contact plugs 17A in the cell region. Currently, an additional recess dry etching process is performed at the end to reduce the thickness of the inter-layer oxide layer 12 to a certain thickness in order to prevent the excessive etch loss of the storage node contact plugs 17A, resulting in a matching height of the inter-layer oxide layer 12 and the storage node contact plugs 17A.

According to the conventional technology, since the SNC hard mask with severe scattering reflection has been introduced, additional process such as the SNC key open mask, etching, and stripping/cleaning processes have become necessary. Furthermore, the additional recess dry etching process for the inter-layer oxide layer has become necessary to resolve the thickness difference between the portions of the SNC hard mask in the cell region and the peripheral region. Therefore, the whole process has become extremely complicated, and thus, productivity is decreased.

SUMMARY OF THE INVENTION

It is, therefore, an object of the present invention to provide a method for forming a storage node contact in a semiconductor device capable of: maintaining a photoresist margin without performing an SNC key open mask, etching and stripping/cleaning processes which are performed to reduce scattering reflection; and simplifying the whole process by omitting an additional recess dry etching process for an inter-layer oxide layer without an etch loss of the storage node contact.

In accordance with an aspect of the present invention, there is provided a method for forming a storage node contact in a semiconductor device, including: forming an inter-layer oxide layer on a substrate; forming a hard mask containing a nitride material on the inter-layer oxide layer; forming a mask pattern on the hard mask; etching the hard mask; etching the inter-layer oxide layer to form storage node contact holes; removing the hard mask; forming storage node contact spacers on lateral walls of the storage node contact holes; and forming storage node contact plugs filling the storage node contact holes.

BRIEF DESCRIPTION OF THE DRAWINGS

The above and other objects and features of the present invention will become better understood with respect to the following description of the specific embodiments given in conjunction with the accompanying drawings, in which.

DETAILED DESCRIPTION OF THE INVENTION

A method for forming a storage node contact in a semiconductor device using a nitride-based hard mask in accordance with specific embodiments of the present invention will be described in detail with reference to the accompanying drawings.

FIGS. 2A to 2E are cross-sectional views illustrating a method for forming a storage node contact in accordance with a specific embodiment of the present invention.

Figure 1A:
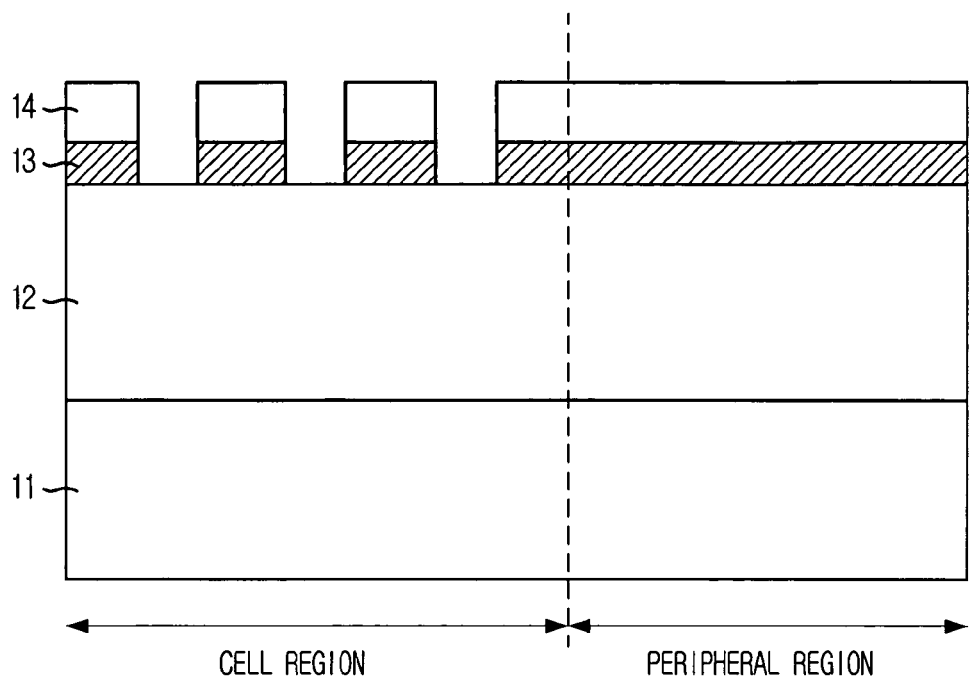
FIGS. 1A to 1C are cross-sectional views illustrating a conventional method for forming a storage node contact in a semiconductor device.
Figure 1B:
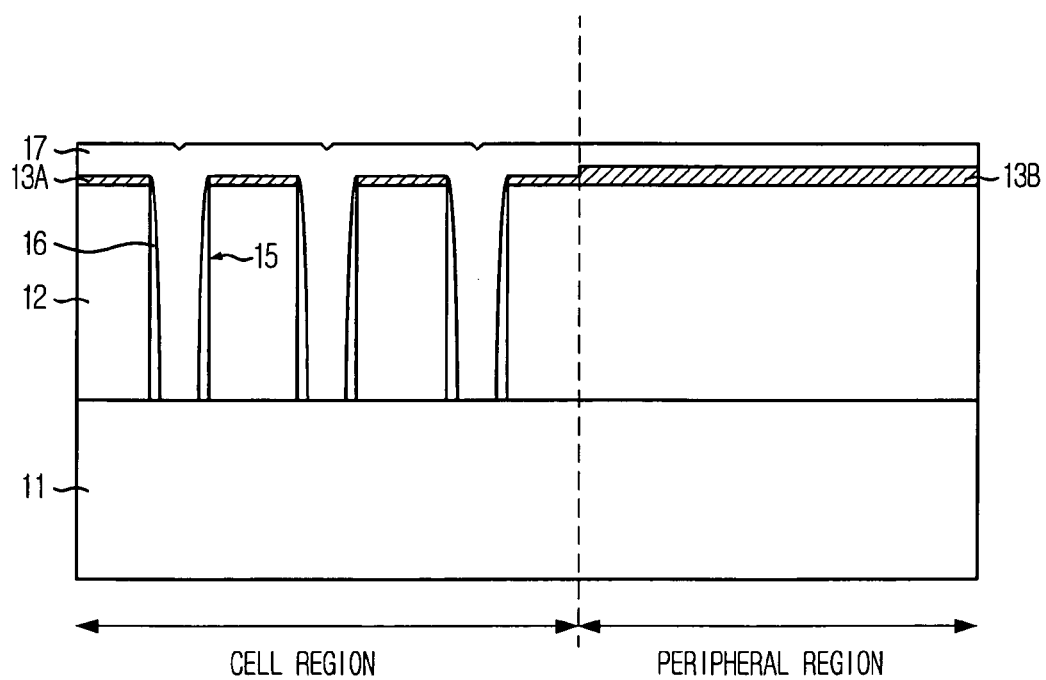
Figure 1C:
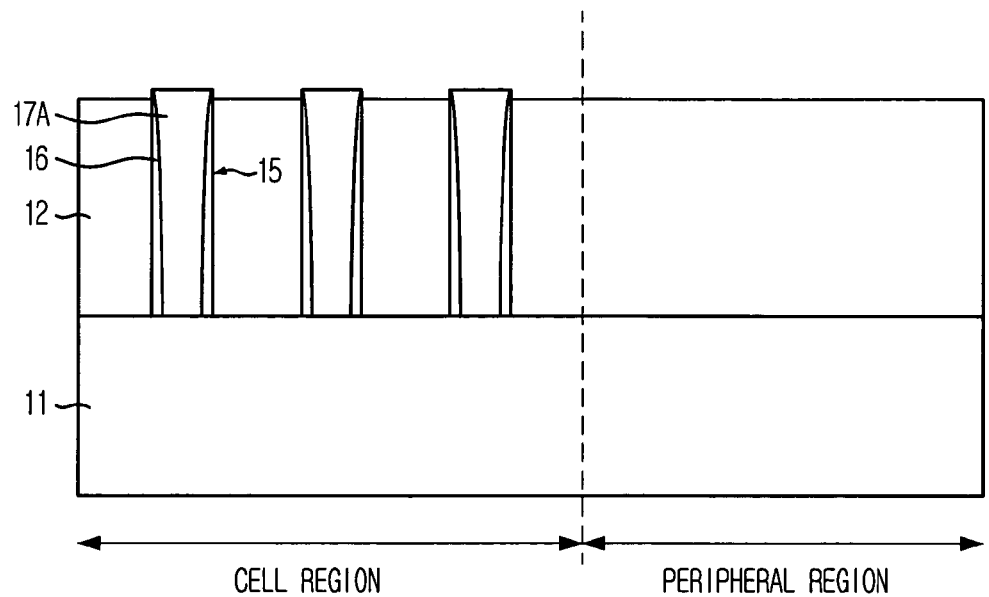
Figure 2A:
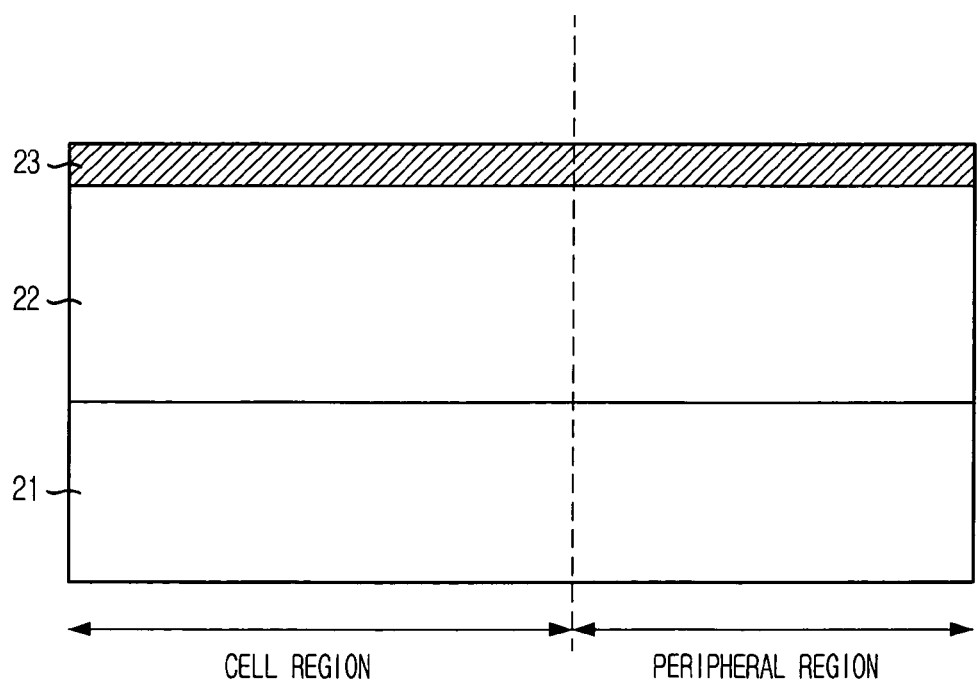
FIGS. 2A to 2E are cross-sectional views illustrating a method for forming a storage node contact in a semiconductor device in accordance with a specific embodiment of the present invention.

As shown in FIG. 2A, an inter-layer oxide layer 22 is formed on a substrate 21. The substrate 21 is defined into a cell region and a peripheral region. Herein, a landing plug contact (not shown) is formed under the inter-layer oxide layer 22. The landing plug contact is formed by employing polysilicon, and the inter-layer oxide layer 22 is formed by employing high density plasma oxide.

Subsequently, a storage node contact (SNC) hard mask 23 is formed on the inter-layer oxide layer 22. Herein, the SNC hard mask 23 is not formed by employing polysilicon. Instead, the SNC hard mask 23 is formed by employing a metal layer containing a nitride material. The nitride material is one of titanium nitride (TiN) and tungsten nitride (WN). The metal layer containing the nitride material has a low scattering reflection rate. Especially, the metal layer has a much lower scattering reflection rate than polysilicon.

Therefore, if the metal layer containing the nitride material with the low scattering reflection rate is employed as the SNC hard mask 23 to function as an anti-scattering reflection coating layer during a photo process, then an SNC key open mask, etching and stripping/cleaning processes are not required.

Figure 2B:
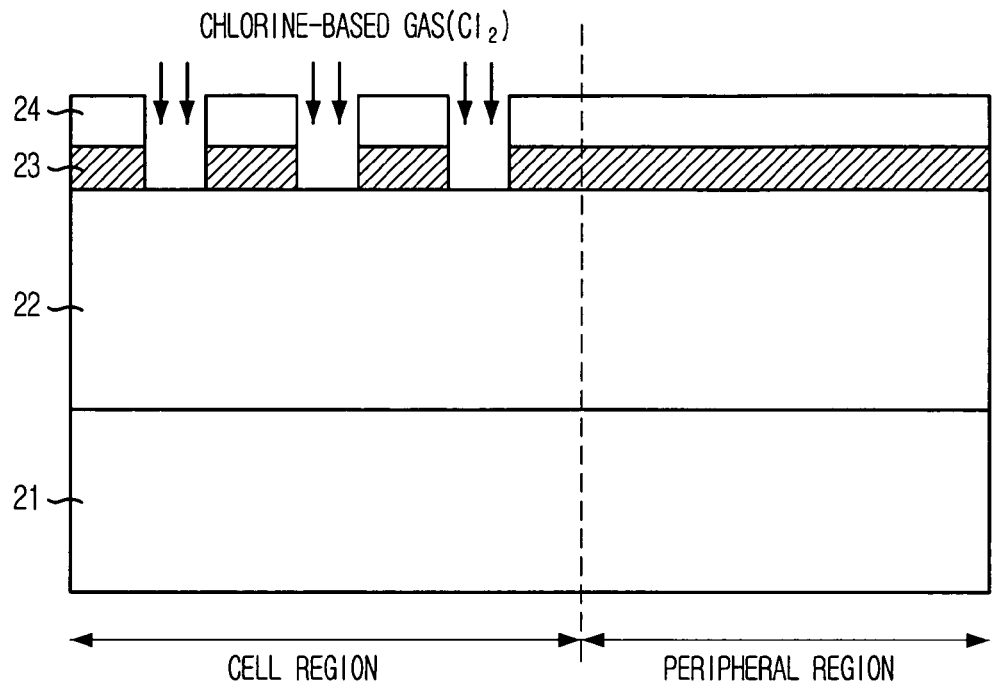

As shown in FIG. 2B, SNC mask pattern 24 is formed on the SNC hard mask 23, and then, portions of the SNC hard mask 23 are etched using the SNC mask pattern 24 as an etch barrier to thereby form an SNC hard mask pattern 23A and 23B.

Herein, a chlorine ($Cl_2$)-based gas is utilized as an etch gas, i.e., a $Cl_2$ gas. The $Cl_2$-based gas is generally used as a polysilicon etch gas.

Figure 2C:
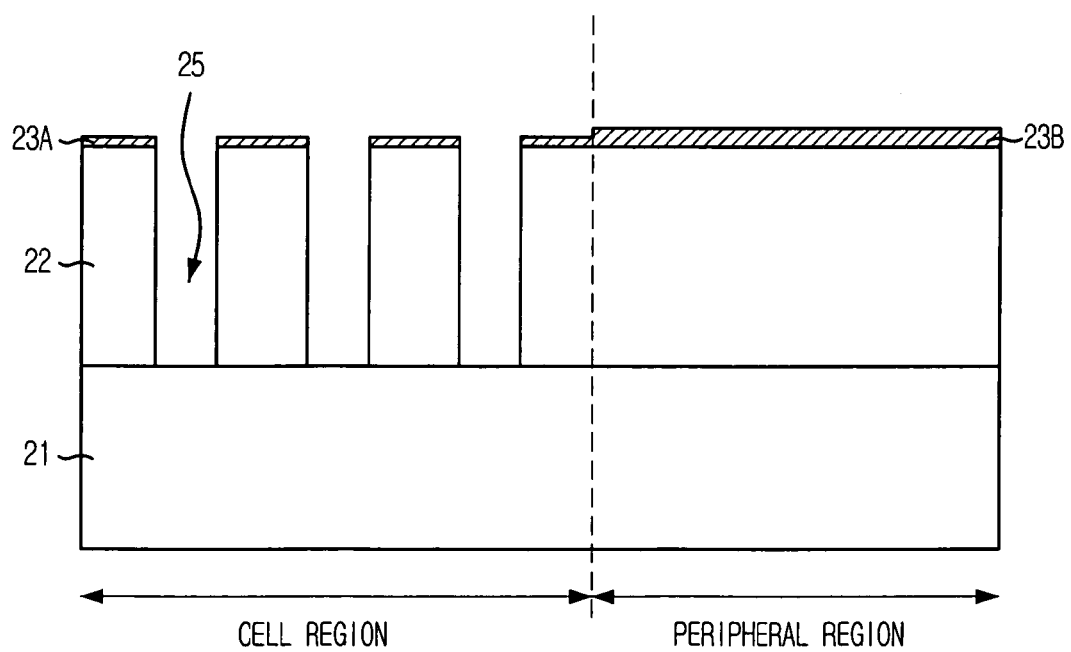

As shown in FIG. 2C, after stripping the SNC mask pattern 24, portions of the inter-layer oxide layer 22 are etched using the SNC hard mask pattern 23A and 23B as an etch barrier to form storage node contact holes 25 exposing portions of the substrate 21.

After the inter-layer oxide layer 22 is etched, the remaining SNC hard mask pattern 23A and 23B in the cell region and the peripheral region shows a regional thickness difference. An etch loss is more severe in the portion of the SNC hard mask pattern 23A in the finely patterned cell region than the portion of the SNC hard mask pattern 23B in the peripheral region with no pattern. Thus, the portion of the SNC hard mask pattern 23B in the peripheral region remains thicker after the inter-layer oxide layer 22 is etched.

Thus, in the specific embodiment of the present invention, cleaning processes are performed to remove the remaining SNC hard mask pattern 23A and 23B with a thickness difference, and a polymer and a photoresist residue generated during the etching of the inter-layer oxide layer 22.

Figure 2D:
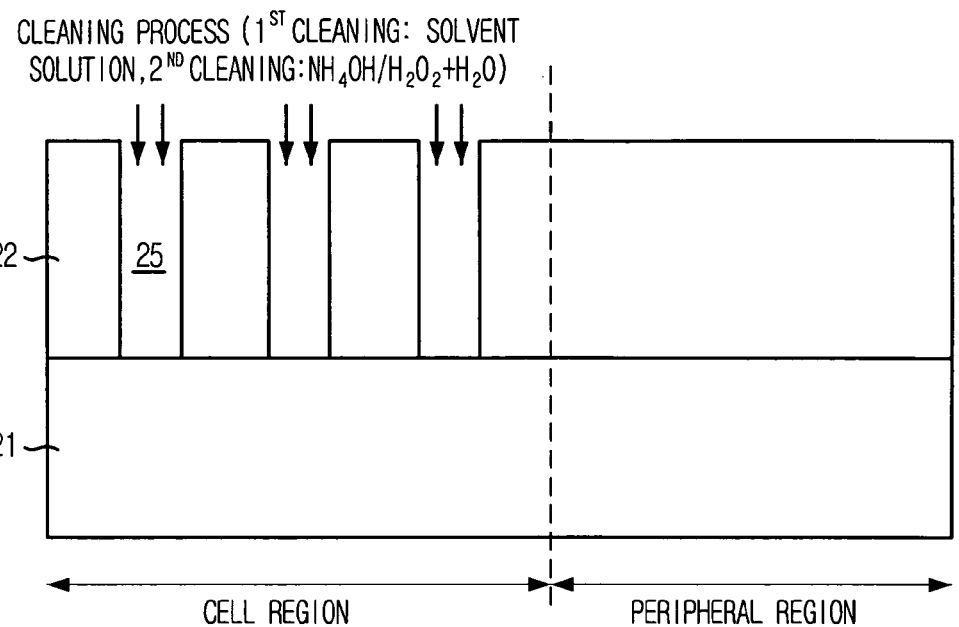

As shown in FIG. 2D, the cleaning processes are performed to remove the remaining SNC hard mask pattern 23A and 23B with the difference in thickness, and the polymer and the photoresist residue generated during the etching of the inter-layer oxide layer 22. The cleaning processes consist of performing two separate processes at an identical wet station, i.e., a first cleaning process and a second cleaning process.

In the first cleaning process, the polymer and the photoresist residue are removed using a solvent solution in a first bath, and in the second cleaning process, the remaining SNC hard mask pattern 23A and 23B is removed by a mixed solution of an ammonium hydroxide ($NH_4OH$)/hydrogen peroxide ($H_2O_2$) solution and water ($H_2O$) in a second bath.

During the first and the second cleaning processes, the solvent solution and the mixed solution are maintained at a temperature ranging from approximately 30° C. to approximately 150° C. in the first and the second baths, respectively. During the second cleaning process, a ratio of $NH_4OH$ to $H_2O_2$ to $H_2O$ of the mixed solution is in a range of approximately 1:2 to 6:10 to 30, increasing an etch efficiency of the SNC hard mask pattern 23A and 23B. Herein, the ratio of $H_2O$ to $NH_4OH$ is greater than that of $H_2O_2$ to $NH_4OH$.

Figure 3:
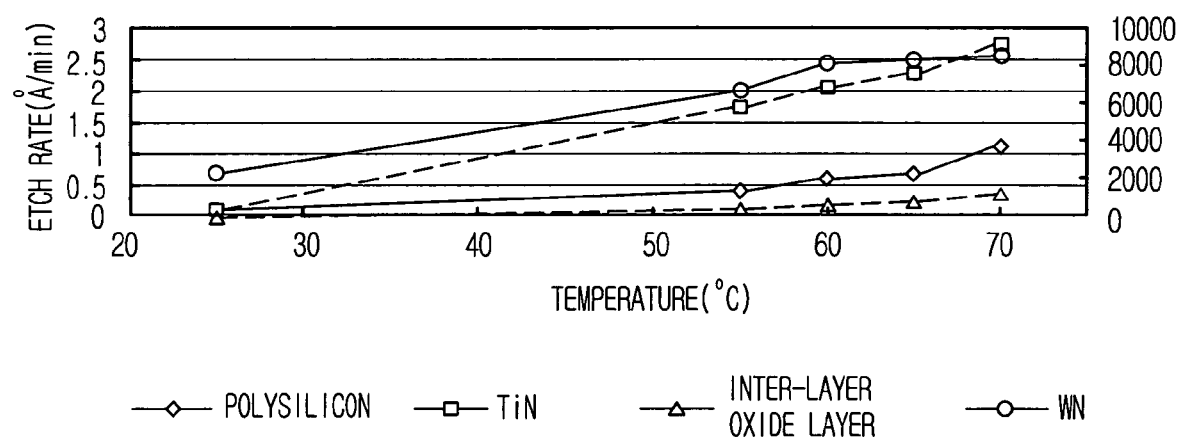
FIG. 3 is a graph illustrating etching rates of layers exposed to cleaning processes in accordance with the specific embodiment of the present invention.

FIG. 3 is a graph illustrating etching rates of layers exposed to the cleaning processes in accordance with the specific embodiment of the present invention. The layers refer to: the substrate (the landing plug contact made of polysilicon); the inter-layer oxide layer (the high density plasma oxide layer); the SNC hard mask formed with TiN or WN, exposed to the cleaning process after the storage node contact holes are formed, respectively.

Referring to FIG. 3, TiN and WN employed as the SNC hard mask 23 show higher etching rates than an inter-layer oxide layer and polysilicon.

Because TiN and WN employed as the SNC hard mask 23 have the high etching rates, the SNC hard mask 23 can be selectively sheeted off without damaging a bottom layer during the first and the second cleaning processes. For reference, when polysilicon is employed as an SNC hard mask in the conventional technology, a cleaning process using a buffered oxide etchant solution is performed after storage node contact holes are formed. Herein, a polymer and a photoresist residue can be removed, but it is difficult to remove polysilicon. Even if polysilicon is removed, it is inevitable for an inter-layer oxide layer at the bottom to be damaged during the removal of polysilicon. Thus, a height of the storage node contact holes decrease and deformation occurs.

According to the cleaning processes of the specific embodiment of the present invention, the SNC hard mask pattern 23A and 23B with the thickness difference remaining in the cell region and the peripheral region is selectively and completely removed. Thus, the inter-layer oxide layer 22 is not damaged and the storage node contact holes 25 are not deformed.

Figure 2E:
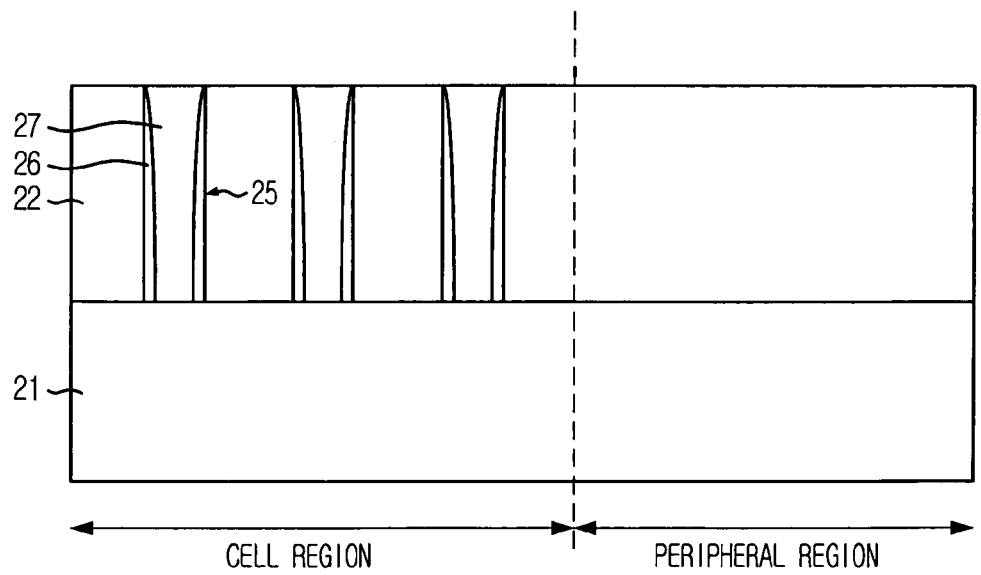

As shown in FIG. 2E, a nitride layer for use as SN spacers is formed over the inter-layer oxide layer 22 and the storage node contact holes 25 where the cleaning processes has been completed. Then, a blanket etch-back process is performed to form SNC spacers 26 formed on lateral walls of the storage node contact holes 25.

Next, polysilicon is deposited on the above resulting substrate structure until the storage node contact holes 25 are filled, and then, a blanket polysilicon etch-back process is performed to form storage node contact plugs 27 buried in the storage node contact holes 25.

A recess dry etching process for the inter-layer oxide layer 22 is not necessary because the blanket polysilicon etch-back process is performed after the SNC hard mask pattern 23A and 23B with difference heights in the cell region and the peripheral region is removed.

In accordance with the specific embodiment of the present invention, the photoresist margin can be maintained, and the scattering reflection can be reduced by employing the metal layer containing the nitride material as a hard mask material to form the storage node contact holes. Thus, the key open mask, etching, and stripping/cleaning processes can be omitted. Also, because the SNC hard mask is completely removed during the cleaning processes after the storage node contact holes are formed, the storage node contact holes are not deformed and the recess dry etching process for the inter-layer oxide layer is not necessary. As a result, the whole process can be simplified.

The present application contains subject matter related to the Korean patent application No. KR 2005-0058563, filed in the Korean Patent Office on Jun. 30, 2005, the entire contents of which being incorporated herein by reference.

While the present invention has been described with respect to certain specific embodiments, it will be apparent to those skilled in the art that various changes and modifications may be made without departing from the spirit and scope of the invention as defined in the following claims.

What is claimed is:

1. A method for forming a storage node contact in a semiconductor device, comprising:
    forming an inter-layer oxide layer on a substrate;
    forming a metal layer containing a nitride material on the inter-layer oxide layer as a hard mask;
    forming a mask pattern on the hard mask;
    etching the hard mask to form a hard mask pattern;
    etching the inter-layer oxide layer to form storage node contact holes;
    removing the hard mask pattern;
    forming storage node contact spacers on lateral walls of the storage node contact holes; and
    forming storage node contact plugs filling the storage node contact holes,
    wherein removing the hard mark pattern is performed in a substantially identical wet station by employing a first cleaning process for removing a polymer and a photoresist residue generated during the etching of the inter-layer oxide layer, and a second cleaning process for removing the hard mask pattern.

2. The method of claim 1, wherein the hard mask is formed with one of titanium nitride (TiN) and tungsten nitride (WN).

3. The method of claim 1, wherein the first cleaning process is performed by using a solvent solution.

4. The method of claim 3, wherein a temperature of the solvent solution is maintained in a range from approximately 30° C. to approximately 150° C.

5. The method of claim 1, wherein the second cleaning process is performed by using a mixed solution of an ammonium hydroxide ($NH_4OH$)/hydrogen peroxide ($H_2O_2$) solution and water ($H_2O$).

6. The method of claim 5, wherein a temperature of the mixed solution is maintained in a range from approximately 30° C. to approximately 150° C.

7. The method of claim 5, wherein a ratio of $H_2O$ to $NH_4OH$ is greater than that of $H_2O_2$ to $NH_4OH$.

8. The method of claim 7, wherein the minimum ratio of $H_2O$ to $NH_4OH$ is larger than the maximum ratio of $H_2O_2$ to $NH_4OH$.

9. The method of claim 8, wherein the ratio of $H_2O_2$ to $NH_4OH$ is in a range of approximately 2 to 6:1 during the second cleaning process.

10. The method of claim 8, wherein the ratio of $H_2O$ to $NH_4OH$ is in a range of approximately 10 to 30:1 during the second cleaning process.

* * * * *